United States Patent
Sheedy et al.

(10) Patent No.: US 11,318,553 B2
(45) Date of Patent: May 3, 2022

(54) ADDITIVE MANUFACTURING OF LAMINATED SUPERALLOYS

(71) Applicant: United Technologies Corporation, Farmington, CT (US)

(72) Inventors: Paul Sheedy, Bolton, CT (US); John A. Sharon, West Hartford, CT (US); Wayde R. Schmidt, Pomfret Center, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 791 days.

(21) Appl. No.: 16/240,308

(22) Filed: Jan. 4, 2019

(65) Prior Publication Data

US 2020/0215640 A1  Jul. 9, 2020

(51) Int. Cl.
| | |
|---|---|
| *B23P 15/02* | (2006.01) |
| *B23P 15/04* | (2006.01) |
| *B23K 10/02* | (2006.01) |
| *B22F 7/02* | (2006.01) |
| *B33Y 80/00* | (2015.01) |
| *B33Y 10/00* | (2015.01) |
| *C30B 29/52* | (2006.01) |

(52) U.S. Cl.
CPC ............ *B23K 10/027* (2013.01); *C30B 29/52* (2013.01)

(58) Field of Classification Search
CPC ....... B23P 15/02–04; B23K 10/02–022; B23K 26/21–242; B33Y 80/00; B33Y 10/00; C30B 29/52; B22F 7/02–04
See application file for complete search history.

(56) References Cited

U.S. PATENT DOCUMENTS

| | | | |
|---|---|---|---|
| 4,203,706 A | 5/1980 | Hess | |
| 4,921,405 A | 5/1990 | Wilson | |
| 5,902,687 A | 5/1999 | Ohashi et al. | |
| 6,384,365 B1 | 5/2002 | Seth et al. | |
| 7,967,570 B2 | 6/2011 | Shi et al. | |
| 10,012,088 B2 | 7/2018 | Slavens et al. | |
| 2009/0008428 A1* | 1/2009 | Kaibyshev | B23K 20/023 228/103 |
| 2010/0054933 A1 | 3/2010 | Allister | |
| 2011/0143162 A1 | 6/2011 | Merrill et al. | |

(Continued)

FOREIGN PATENT DOCUMENTS

DE  102014226370 A1  6/2016

OTHER PUBLICATIONS

Extended European Search Report for EP Application No. 19218964.5, dated Feb. 4, 2020, 6 pages.

*Primary Examiner* — Michael A Laflame, Jr.
(74) *Attorney, Agent, or Firm* — Kinney & Lange, P.A.

(57) ABSTRACT

An embodiment of a method includes fabricating a first single crystal boule having a uniform composition and grain orientation. The first uniform single crystal boule is divided into a first plurality of layered shapes. The shapes of the first plurality are stacked with at least a second plurality of layered shapes along a first axis. The second plurality of layered shapes have at least one physical aspect differing from at least one corresponding physical aspect of the first plurality of layered shapes. The first plurality of layered shapes and at least the second plurality of layered shapes are joined via a field assisted sintering technique (FAST) to form a bulk component.

20 Claims, 3 Drawing Sheets

(56) References Cited

U.S. PATENT DOCUMENTS

| | | | |
|---|---|---|---|
| 2015/0224607 A1* | 8/2015 | Bruck | B22F 3/105 228/56.3 |
| 2016/0158840 A1 | 6/2016 | Cologna et al. | |
| 2017/0080526 A1 | 3/2017 | Bruck | |
| 2017/0334023 A1 | 11/2017 | Mohr | |
| 2019/0229252 A1* | 7/2019 | Leblanc | C04B 35/547 |
| 2020/0298312 A1* | 9/2020 | Liu | B22F 9/04 |
| 2021/0002138 A1* | 1/2021 | Kobayashi | C01B 21/072 |
| 2021/0254474 A1* | 8/2021 | Farris | F01D 5/20 |

* cited by examiner

ADDITIVE MANUFACTURING OF LAMINATED SUPERALLOYS

BACKGROUND

This disclosure relates generally to additive manufacturing and more specifically to additive manufacturing of superalloys.

Many aerospace alloys, in particular single crystal superalloys, can be challenging to manufacture and are not often easily amenable to additive manufacturing. Casting of single crystals can be a sensitive operation requiring careful control over melting and solidification processes, and use of grain selectors, etc. which add to the cost and present inherent limitations. For example, such processes cannot explicitly dial in certain orientations and will produce mis-orientations, lower yields, impurities, etc.

Investment casting is, for the most part, still the preferred approach for casting of single crystal components, such as those used in gas turbine or other sensitive, high temperature applications. However, complicated internal shapes require complicated casting arrangements and often result in high scrap rates.

SUMMARY

An embodiment of a method includes fabricating a first single crystal boule having a uniform composition and grain orientation. The first uniform single crystal boule is divided into a first plurality of layered shapes. The shapes of this first plurality are stacked with at least a second plurality of layered shapes along a first axis. The second plurality of layered shapes have at least one physical aspect differing from at least one corresponding physical aspect of the first plurality of layered shapes. The first plurality of layered shapes and at least the second plurality of layered shapes are joined via a field assisted sintering technique (FAST) to form a bulk component.

DETAILED DESCRIPTION

This disclosure is related to implementing a laminated object manufacturing (LOM) additive approach to single crystal and other superalloy materials. Generally, the method includes starting with a basic casting of a single crystal boule of material having a uniform cross section. The boule can then be divided in various ways into prescribed layered shapes with preferred orientations. Those layers can be laminated and recombined with each other (e.g., with different crystal orientations), or combined, stacked, or interleaved with other layered feedstocks such as directional or polycrystalline layers along one or more axes. The joining of the combination/lamination is performed using a field assisted sintering technique (FAST, aka spark plasma sintering or SPS).

The process can be practiced with various materials across a gas turbine engine or other components like heat exchangers. Deconstructing the fabrication method will simplify the process for forming aerospace alloys (i.e. investment cast single crystals) by using a uniform feedstock boule of material that does not require a grain selector. Further, deconstruction of component fabrication into a layered object manufacturing (LOM) approach, using layers machined from one or more feedstocks, will open new design possibilities not available through conventional casting routes.

Figure 1:
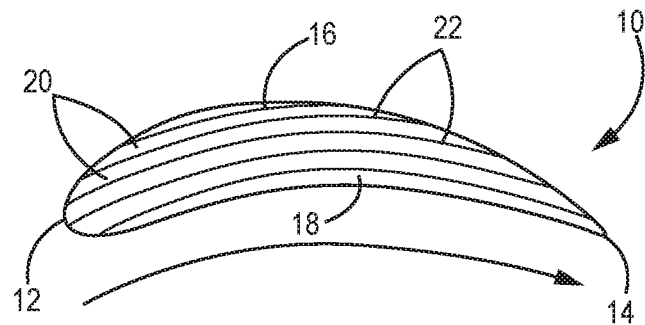
FIG. 1 shows an example airfoil cross-section.
Figure 2:
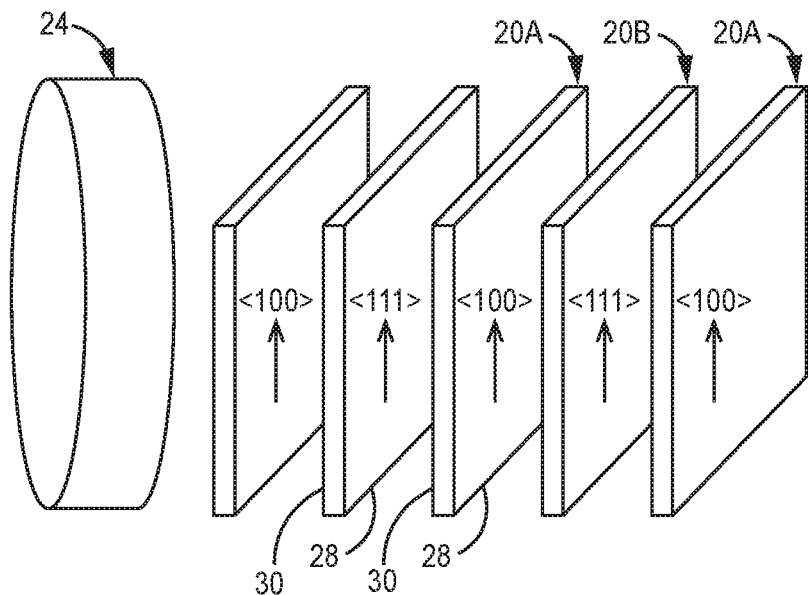
FIG. 2 depicts layers of superalloy, with some taken from a single crystal boule.

FIGS. 1 and 2 show a basic implementation of one illustrative embodiment of the process. In this example, FIG. 1 shows a cross-section of airfoil 10. As is generally known, airfoils include leading edge 12, trailing edge 14, suction wall 16, and pressure wall 18. Airfoil 10 is formed by laminated layers 20 and joined along bond lines 22. The thickness of layers 20 and bond lines 22 are exaggerated for clarity.

FIG. 2 shows individual layers 20 that can be used to form airfoil 10 or any other suitable component. First, fabricate uniform single crystal boule 24, and divide or machine into sheets or other suitable layered shapes 20. Boule 24 can have a uniform composition and/or grain orientation, preferably along a longitudinal axis. Resulting sheets 20 are oriented according to a desired crystal configuration, then bonded and/or joined with a FAST process along surfaces 28, 30 to form a bulk component (e.g., airfoil 10 in FIG. 1). Sheets 20 can be joined directly to one another, or indirectly via intermediate layers, coatings, and/or bonding agents (not shown for clarity). Sheets 20 may have the same or different thicknesses.

'Interfaces' between sheets/layered shapes can have an engineered or inherent misfit or compliance which could add a dimension to the strengthening of a component. This is done by varying at least one physical aspect of the sheets/layered shapes along at least one axis of the eventual bulk component. For example, the at least one physical aspect can be selected from an alloy composition, a number of crystals, a grain size distribution, a crystal orientation, and combinations thereof. The at least one physical aspect can be varied along the axis so that, for example, the number of crystals, crystal orientation, alloy composition or other aspect(s) can alternate between groups of layered shapes, or the layered shapes can be arranged and stacked such that adjacent ones or adjacent groups vary only slightly, allowing for a graded component along at least one axis of the bulk component.

Such tailoring of features can also prevent potential recrystallization in some cases. In this way, one can laminate various shapes of single crystal with well-known orientations using a laminated object manufacturing (LOM) approach without the uncertainty and losses connected to traditional investment casting. The method also allows easier fabrication of single crystal feedstock shapes and orientations without having to use a grain selector.

Figure 3:
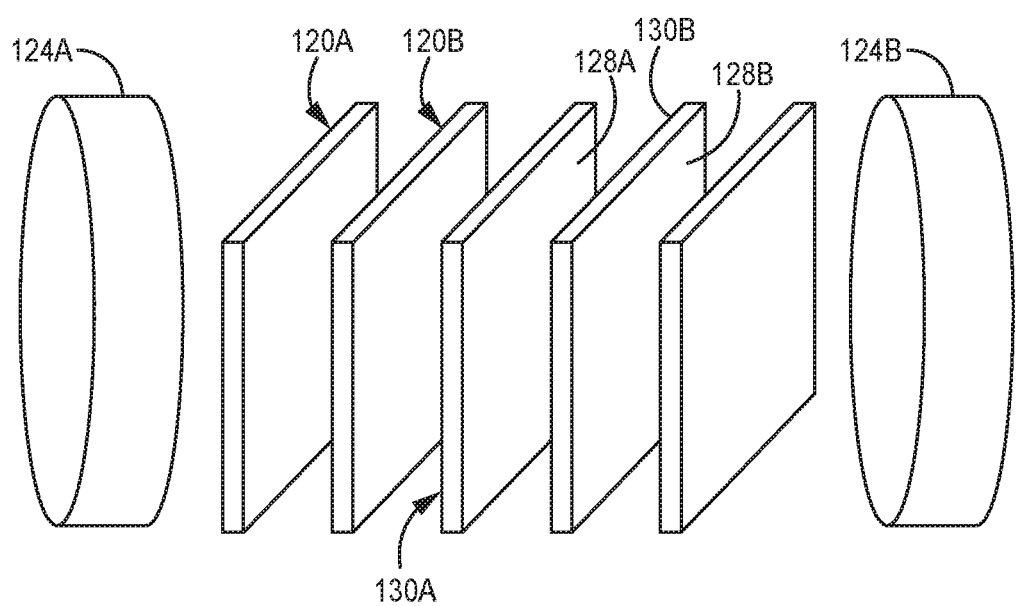
FIG. 3 shows layers with differing crystal orientations.

FIG. 3 depicts a second example embodiment, here implementing the method to form a multilayer single crystal. Two or more individual layers 120A and 120B can be used to form a component such as airfoil 10 in FIG. 1. Similar to FIGS. 1 and 2, one or more uniform single crystal boule(s) 124A, 124B are formed and divided into sheets or other suitably shaped layers 120A, 120B. These are oriented in a desired manner, stacked or interleaved such that they can be layered then joined or bonded with a FAST process along surfaces 128A, 128B, 130A, and/or 130B as above to form a bulk component. Sheets 120A, 120B can be two or more varying single crystal compositions, orientations of the same or different single crystals, or combinations thereof. Instead of alternating as shown in FIG. 3, it will be appreciated that the composition and/or grain orientation of sheets 120A, 120B can be graded along a build axis, such as but not limited to, an airfoil span or chord direction. Sheets 120 may have the same or different thicknesses.

Under this approach, one can laminate various orientations or compositions of single crystals into a single component. Preferred orientations or compositions could be located at preferred locations of a component e.g., higher modulus compositions or orientations along the long axis of a blade or at the surface. In other words, this can be seen as a method for producing materials with the same or better properties than conventional "directionally solidified". It can also result in graded materials with highly controlled compositions and/or grain orientations.

Figures 4A, 4B:
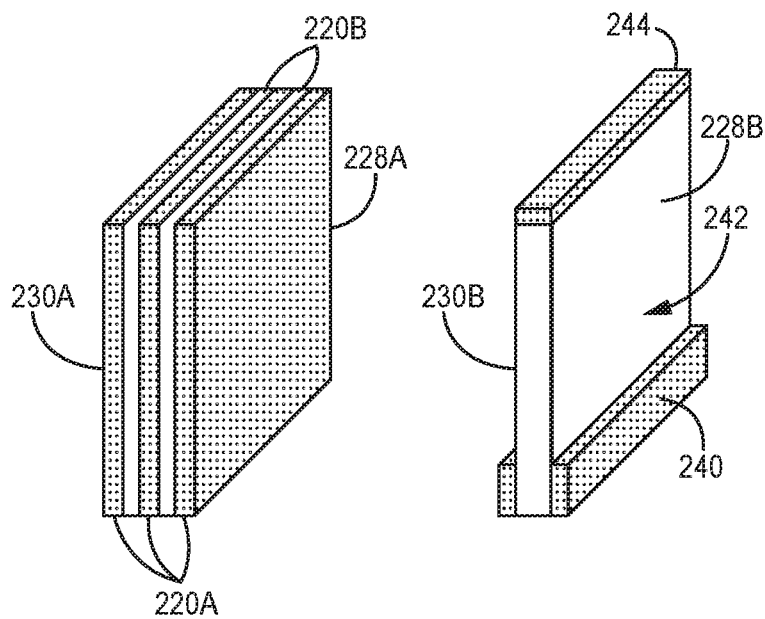
FIG. 4A is a second example embodiment using a combination of single crystal layers and polycrystalline layers.
FIG. 4B is a third example embodiment using a combination of single crystal layers and polycrystalline layers.

In a third example embodiment, shown in FIGS. 4A and 4B, one can form a layup of multilayer single crystal and polycrystalline materials to optimize mechanical or wear properties for different parts of the bulk component. For example, certain areas of a bulk component that are creep limited may be best suited to have a single crystal orientation, while other areas may benefit from a polycrystalline structure (fatigue limited for example). Additionally and/or alternatively, certain areas of a bulk component may be best suited to have a more creep-resistant alloy composition, while other areas may benefit from a wear-resistant composition.

Again, the process begins by fabricating at least one uniform single crystal feedstock (e.g., a boule such as is shown in prior figures), as well as a second, preferably polycrystalline feedstock. The single crystal boule is divided into sheets or other layered shapes 220A. Sheets 220B of a second polycrystalline feedstock are provided or fabricated as well. These are oriented in a desired manner, stacked or interleaved such that they can be layered then joined or bonded with a FAST process along surfaces 228A, 228B, 230A, and/or 230B as above to form a bulk component. This can be done with or without interlayers such as integral coatings, bonding agents and/or discrete ceramic interlayers between sheets 220A, 220B as needed.

Sheets 220A, 220B may be varying single- or poly-crystal compositions, orientations of the same or different single crystals, different grain sizes of polycrystalline materials, or combinations thereof. Sheets 220 may have the same or different thicknesses.

For example, in a gas turbine airfoil, one can arrange sheets 220A, 220B and laminate various preferred grain morphologies at preferred locations of a component. As shown in FIG. 4B the fabricated structure can include polycrystalline root 240, single crystal body/airfoil 242, and polycrystalline blade tip 244. Polycrystalline materials are more resistant to wear and thus more suited for areas likely to experience contact or friction (i.e., root 240 rubbing against edges of a blade retaining slot, or tip 244 rubbing against an outer ring/air seal).

Figure 5:
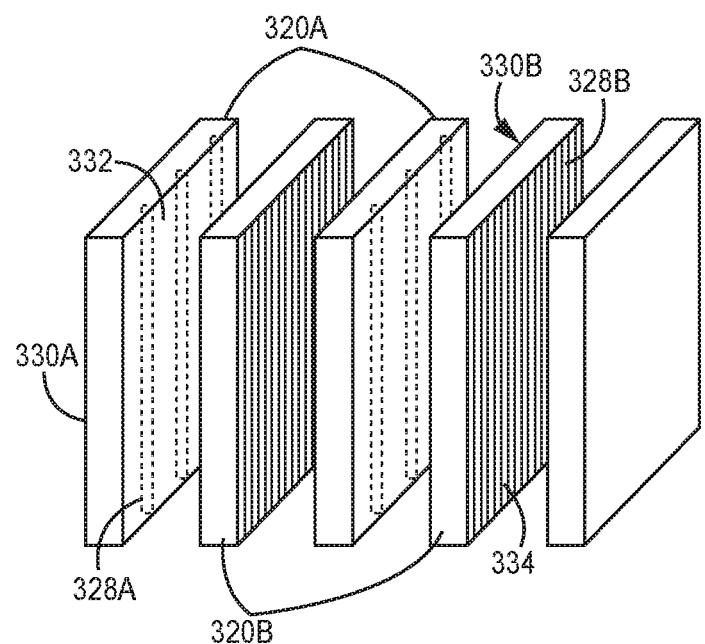
FIG. 5 is a fourth example embodiment with integral features formed into at least some of the layers.

The fourth example embodiment, depicted in FIGS. 5 (side view) and 6 (top view), can be incorporated into any of the prior three examples to implement internal geometries or other features that are difficult or impossible to achieve through conventional casting or through prior additive techniques. With a layered/laminate process, these still can maintain or exceed the required mechanical properties of corresponding parts made by conventional casting.

As in prior examples, at least one single crystal boule is formed, divided into sheets or other suitable layered shapes 320A, 320B. These are oriented in a desired manner, stacked or interleaved such that they can be layered then joined or bonded with a FAST process along surfaces 328A, 328B, 330A, and/or 330B as above to form a bulk component. This can be done with or without interlayers/coatings or bonding agents between sheets 320A, 320B as needed. Sheets 320 may have the same or different thicknesses.

Figure 6:
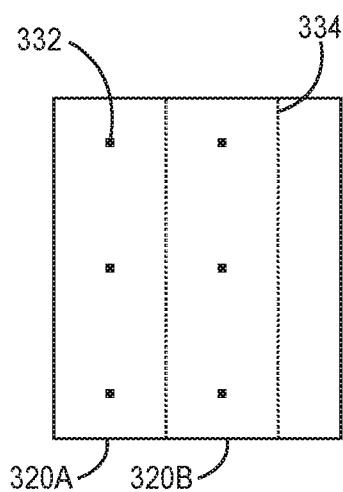
FIG. 6 is a top view of the layers from FIG. 5.

As seen in FIGS. 5 and 6, sheets 320A and/or 320B may have in-plane or through thickness features 332, 334 which upon lamination can be aligned and integrated to provide integral functionality beyond that seen in the other examples. With this approach, one can laminate various orientations or compositions of single crystals and optionally polycrystalline materials into a component using a laminated object manufacturing (LOM) approach. In one example, subtractions that can be incorporated into individual layers 320A, 320B prior to lamination may result in formation of integral cooling, alignment or compliance features between layers. Due to the nature of the process, these integral features can be far more fine/precise and consistent as compared to conventional casting, where issues such as core shift and tolerance stacking mean that one must allow for larger variations in the design from part to part. Otherwise, attempting to form such fine features via conventional investment casting result in very high, unacceptable scrap rates.

Discussion of Possible Embodiments

A method according to an exemplary embodiment of this disclosure, among other possible things, includes fabricating a first single crystal boule having a uniform composition and grain orientation; dividing the first uniform single crystal boule into a first plurality of layered shapes; stacking the first plurality of layered shapes with at least a second plurality of layered shapes along a first axis, the second plurality of layered shapes having at least one physical aspect differing from at least one corresponding physical aspect of the first plurality of layered shapes; and joining the first plurality of layered shapes and at least the second plurality of layered shapes via a field assisted sintering technique (FAST) to form a bulk component.

The method of the preceding paragraph can optionally include any one or more of the following features, configurations and/or additional components:

A further example of the foregoing method, wherein the at least one physical aspect is selected from: an alloy composition, a number of crystals, a grain size distribution, a crystal orientation, and combinations thereof.

A further example of any of the foregoing methods, wherein the at least one physical aspect includes the crystal orientation; and the stacking step includes orienting adjacent ones of the first plurality of layered shapes such that a bulk crystal orientation of the component is graded along the first axis.

A further example of any of the foregoing methods, wherein the at least one physical aspect includes the crystal orientation; and the stacking step includes alternating adjacent ones of the first plurality of layered shapes and ones of the second plurality of layered shapes such that a bulk crystal orientation alternates along the first axis between a first bulk orientation and a second bulk orientation.

A further example of any of the foregoing methods, wherein the at least one physical aspect includes the alloy composition; and the stacking step includes varying the alloy composition of ones of the first plurality of layered shapes such that a bulk alloy composition is graded along the first axis.

A further example of any of the foregoing methods, wherein the at least one physical aspect includes the alloy composition; and the stacking step includes alternating adjacent ones of the first plurality of layered shapes and ones of the second plurality of layered shapes such that a bulk alloy composition of the component alternates along the first axis between a first bulk alloy composition and a second bulk alloy composition.

A further example of any of the foregoing methods, further comprising providing a second feedstock and dividing the second feedstock into the second plurality of layered shapes.

A further example of any of the foregoing methods, wherein the second feedstock is a second uniform boule.

A further example of any of the foregoing methods, wherein the second uniform boule is a single crystal or a directionally solidified polycrystalline boule.

A further example of any of the foregoing methods, further comprising: providing an interlayer between ones of the first plurality of layered shapes and the second plurality of layered shapes.

A further example of any of the foregoing methods, wherein the interlayer comprises a coating formed on at least one of the first plurality of layered shapes and the second plurality of layered shapes.

A further example of any of the foregoing methods, wherein the interlayer comprises a discrete ceramic interlayer.

A further example of any of the foregoing methods, further comprising: processing at least one of the first plurality of layered shapes and the second plurality of layered shapes to provide an in-plane or through thickness feature.

A further example of any of the foregoing methods, wherein the stacking step includes arranging the first plurality of layered shapes and the second plurality of layered shapes to align each in-plane or through thickness feature to provide integral internal features in the bulk component.

A further example of any of the foregoing methods, further comprising: providing a third plurality of layered shapes; stacking the third plurality of layered shapes with the first plurality of layered shapes and the at least second plurality of layered shapes along a second axis different from the first axis; and joining the third plurality of first plurality of layered shapes with the first plurality of layered shapes and the at least second plurality of layered shapes via the field assisted sintering technique (FAST) to form the bulk component.

A further example of any of the foregoing methods, wherein the third plurality of layered shapes have at least one physical aspect differing from at least one corresponding physical aspect of both the first plurality of layered shapes and the second plurality of layered shapes.

A further example of any of the foregoing methods, wherein the third plurality of layered shapes are polycrystalline and both the first plurality of layered shapes and the second plurality of layered shapes are single crystal.

A further example of any of the foregoing methods, wherein the bulk component is a rotor blade for a gas turbine engine, or a precursor thereof.

A further example of any of the foregoing methods, wherein the first plurality of layered shapes have a first thickness along the first axis, and the second plurality of layered shapes have a second thickness along the first axis, less than the first thickness.

A further example of any of the foregoing methods, wherein at least one of the first feedstock and the second feedstock comprises at least one of an equiaxed billet and a textured billet formed via a forging, a hot rolling, or an extrusion process.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method comprising:
   fabricating a first single crystal boule having a uniform composition and grain orientation;
   dividing the first uniform single crystal boule into a first plurality of layered shapes;
   stacking the first plurality of layered shapes with at least a second plurality of layered shapes along a first axis, the second plurality of layered shapes having at least one physical aspect differing from at least one corresponding physical aspect of the first plurality of layered shapes; and
   joining the first plurality of layered shapes and at least the second plurality of layered shapes via a field assisted sintering technique (FAST) to form a bulk component.

2. The method of claim 1, wherein the at least one physical aspect is selected from: an alloy composition, a number of crystals, a grain size distribution, a crystal orientation, and combinations thereof.

3. The method of claim 2, wherein the at least one physical aspect includes the crystal orientation; and the stacking step includes orienting adjacent ones of the first plurality of layered shapes such that a bulk crystal orientation of the component is graded along the first axis.

4. The method of claim 2, wherein the at least one physical aspect includes the crystal orientation; and the stacking step includes alternating adjacent ones of the first plurality of layered shapes and ones of the second plurality of layered shapes such that a bulk crystal orientation alternates along the first axis between a first bulk orientation and a second bulk orientation.

5. The method of claim 2, wherein the at least one physical aspect includes the alloy composition; and the stacking step includes varying the alloy composition of ones of the first plurality of layered shapes such that a bulk alloy composition is graded along the first axis.

6. The method of claim 2, wherein the at least one physical aspect includes the alloy composition; and the stacking step includes alternating adjacent ones of the first plurality of layered shapes and ones of the second plurality of layered shapes such that a bulk alloy composition of the component alternates along the first axis between a first bulk alloy composition and a second bulk alloy composition.

7. The method of claim 1, further comprising providing a second feedstock and dividing the second feedstock into the second plurality of layered shapes.

8. The method of claim 7, wherein the second feedstock is a second uniform boule.

9. The method of claim 8, wherein the second uniform boule is a single crystal or a directionally solidified polycrystalline boule.

10. The method of claim 1, further comprising: providing an interlayer between ones of the first plurality of layered shapes and the second plurality of layered shapes.

11. The method of claim 10, wherein the interlayer comprises a coating formed on at least one of the first plurality of layered shapes and the second plurality of layered shapes.

12. The method of claim 10, wherein the interlayer comprises a discrete ceramic interlayer.

13. The method of claim 1, further comprising: processing at least one of the first plurality of layered shapes and the second plurality of layered shapes to provide an in-plane or through thickness feature.

14. The method of claim 13, wherein the stacking step includes arranging the first plurality of layered shapes and the second plurality of layered shapes to align each in-plane or through thickness feature to provide integral internal features in the bulk component.

15. The method of claim 1, further comprising: providing a third plurality of layered shapes; stacking the third plurality of layered shapes with the first plurality of layered shapes and the at least second plurality of layered shapes along a second axis different from the first axis; and joining the third plurality of first plurality of layered shapes with the first plurality of layered shapes and the at least second plurality of layered shapes via the field assisted sintering technique (FAST) to form the bulk component.

16. The method of claim 15, wherein the third plurality of layered shapes have at least one physical aspect differing from at least one corresponding physical aspect of both the first plurality of layered shapes and the second plurality of layered shapes.

17. The method of claim 15, wherein the third plurality of layered shapes are polycrystalline and both the first plurality of layered shapes and the second plurality of layered shapes are single crystal.

18. The method of claim 17, wherein the bulk component is a rotor blade for a gas turbine engine, or a precursor thereof.

19. The method of claim 1, wherein the first plurality of layered shapes have a first thickness along the first axis, and the second plurality of layered shapes have a second thickness along the first axis, less than the first thickness.

20. The method of claim 7, wherein at least one of the first feedstock and the second feedstock comprises at least one of an equiaxed billet and a textured billet formed via a forging, a hot rolling, or an extrusion process.

* * * * *